(12) United States Patent
Ogawa

(10) Patent No.: US 9,994,729 B2
(45) Date of Patent: Jun. 12, 2018

(54) LIQUID SEALING MATERIAL, AND ELECTRONIC COMPONENT USING SAME

(71) Applicant: NAMICS CORPORATION, Niigata (JP)

(72) Inventor: Hideaki Ogawa, Niigata (JP)

(73) Assignee: Namics Corporation, Niigata (JP)

( * ) Notice: Subject to any disclaimer, the term of this patent is extended or adjusted under 35 U.S.C. 154(b) by 0 days. days.

(21) Appl. No.: 15/309,972

(22) PCT Filed: Mar. 20, 2015

(86) PCT No.: PCT/JP2015/058558
§ 371 (c)(1),
(2) Date: Nov. 9, 2016

(87) PCT Pub. No.: WO2015/174141
PCT Pub. Date: Nov. 19, 2015

(65) Prior Publication Data
US 2017/0145251 A1    May 25, 2017

(30) Foreign Application Priority Data
May 16, 2014  (JP) ................................ 2014-101923

(51) Int. Cl.
*H01L 23/29*  (2006.01)
*C09D 163/00* (2006.01)
*C09J 163/00* (2006.01)
*C08K 9/06*   (2006.01)

(52) U.S. Cl.
CPC .......... *C09D 163/00* (2013.01); *C09J 163/00* (2013.01); *H01L 23/295* (2013.01); *H01L 23/296* (2013.01); *C08K 9/06* (2013.01); *C08K 2201/005* (2013.01)

(58) Field of Classification Search
CPC .................................................... C09D 163/00
See application file for complete search history.

(56) References Cited

U.S. PATENT DOCUMENTS

| 2010/0171146 A1 | 7/2010 | Takeuchi et al. |
| 2010/0304536 A1 | 12/2010 | Sumita |
| 2012/0267803 A1 | 10/2012 | Lee et al. |

FOREIGN PATENT DOCUMENTS

| JP | 08020673 A | 1/1996 |
| JP | 10173103 A | 6/1998 |
| JP | 11-166105 A | 6/1999 |
| JP | 2000-319633 A | 11/2000 |
| JP | 2001-234031 A | 8/2001 |
| JP | 2004-111519 A | 4/2004 |
| JP | 2011-14885 A | 1/2011 |
| JP | 2011-202177 A | 10/2011 |
| WO | WO 2009/008283 A1 | 1/2009 |

*Primary Examiner* — Marc Armand
*Assistant Examiner* — Sarah Salerno
(74) *Attorney, Agent, or Firm* — Muncy, Geissler, Olds & Lowe, P.C.

(57) ABSTRACT

This liquid sealing material has low thermal expansion and has injection properties for injection into gaps between a semiconductor element and a substrate; this electronic component is formed by sealing a sealing site using the liquid sealing material. This liquid sealing material is characterized by containing (A) a liquid epoxy resin, (B) a curing agent, (C) a silica filler with an average particle diameter of 7-50 nm, surface treated with 2-(3,4-epoxy cyclohexyl) ethyl trimethoxysilane, and (D) a silica filler with an average particle diameter of 0.2-5 μm, wherein relative to a total of 100 parts by mass of all components of the liquid sealing material, the total of the silica filler of component (C) and the silica filler of the component (D) is 45-77 parts by mass, and the mixing ratio (weight ratio) of the silica filler of component (C) and the silica filler of component (D) is 1:10.2-1:559.

5 Claims, No Drawings

LIQUID SEALING MATERIAL, AND ELECTRONIC COMPONENT USING SAME

TECHNICAL FIELD

The present invention relates to a resin composition suitable for a one-pack type adhesive that is required to cure under heating in use. The resin composition of the invention is preferred for a one-pack type adhesive used in manufacturing image sensor modules used as camera modules for mobile phones and smartphones, and electronic components such as semiconductor devices, integrated circuits, large-scale integrated circuits, transistors, thyristors, diodes and capacitors. The resin composition of the invention is also expected to be applied as a liquid sealing material for use in manufacturing semiconductor apparatuses.

BACKGROUND ART

As electronic components get smaller, lighter and more sophisticated, the semiconductor packaging form is changing from wire bonding type to flip-chip type.

A flip-chip semiconductor apparatus has a configuration in which electrode portions on a substrate are connected to a semiconductor device via bump electrodes. The thus configured semiconductor apparatus suffers from the following problem: When heat is applied as in temperature cycling, the bump electrodes are stressed due to a difference in coefficient of thermal expansion between the substrate made of an organic material such as epoxy resin and the semiconductor device, thus causing the bump electrodes to have defects such as cracking. To suppress the occurrence of such defects, it is widely performed to seal gaps between the semiconductor device and the substrate with a liquid sealing material called "underfill" to secure them to each other, thereby improving the thermal cycle resistance.

A liquid sealing material for use as the underfill is required to be excellent in injection properties, adhesive properties, curing properties, storage stability and the like, and not to generate voids. In addition, a portion sealed with the liquid sealing material is required to be excellent in moisture resistance, thermal cycle resistance, reflow resistance, cracking resistance, warpage resistance and the like.

To satisfy the foregoing requirements, an epoxy resin-based material is widely used as the liquid sealing material for use as the underfill.

It is known that controlling the difference in coefficient of thermal expansion between a substrate made of an organic material such as epoxy resin and a semiconductor device and reinforcing bump electrodes by adding a filling material (hereinafter referred to as "filler") made of an inorganic substance such as a silica filler to a liquid sealing material are effective to improve the moisture resistance and the thermal cycle resistance, in particular the thermal cycle resistance of a portion sealed with the liquid sealing material (see Patent Literature 1).

In flip-chip semiconductor apparatuses, with miniaturization of low-K layers and increasing use of lead-free solder bumps and Cu pillars in recent years, a liquid sealing material is required to have much lower thermal expansion (i.e., have a lower coefficient of thermal expansion) in order to prevent a low-K layer from being broken or solder bumps to be cracked due to thermal stress.

On the other hand, gaps between semiconductor devices and substrates and distances between adjacent bumps tend to be smaller.

To achieve lower thermal expansion of an underfill, a high degree of filling (i.e., a high filling rate) of a filler is essential; however, the viscosity of the underfill increases with increasing filling rate of the filler, which leads to poor injection properties of the underfill in injection into gaps between a semiconductor device and a substrate.

Besides, when a silica filler is used, the silica filler has on its surface a number of silanol groups which are hydrophilic groups, therefore does not have a good compatibility with hydrophobic components (e.g., epoxy resin constituting a base compound) of an underfill, and thus tends to exhibit poor filler dispersibility in an underfill.

To achieve a high degree of filling of a filler, a finer filler is to be used; however, such a finer filler leads to the increase in its surface area in an exponential function manner. As a result, dispersibility of the filler deteriorates because of the foregoing reason, which causes the viscosity of an underfill to increase, resulting in poor injection properties of the underfill in injection into gaps between a semiconductor device and a substrate.

Meanwhile, to increase the inorganic filler content, a method in which an inorganic filler is surface-treated with a silane coupling agent is known (for example, see Patent Literature 2).

CITATION LIST

Patent Literature

Patent Literature 1: JP 10-173103 A
Patent Literature 2: JP 8-20673 A

SUMMARY OF INVENTION

Technical Problems

In the invention described in Patent Literature 2, an inorganic filler is surface-treated with a silane coupling agent to increase the inorganic filler content. In the meantime, what is surface-treated with the silane coupling agent is the inorganic filler having an average particle size of 5 to 40 μm.

When an inorganic filler having a finer particle size of the order of nm was surface-treated with the silane coupling agent described in Patent Literature 2, it was revealed that the viscosity of an underfill increases, which results in poor injection properties of the underfill in injection into gaps between a semiconductor device and a substrate, as well as lower storage stability and a shorter pot life thereof.

In order to solve drawbacks of the prior art, the present invention aims at providing a liquid sealing material that can achieve both low thermal expansion and good injection properties in injection into gaps between a semiconductor device and a substrate, and an electronic component in which portions to be sealed are sealed with the liquid sealing material.

Solution to Problems

The present inventor has made an intensive study to achieve the above objects and as a result reached following findings.

As described above, a silica filler has on its surface a number of silanol groups which are hydrophilic groups, therefore does not have a good compatibility with hydrophobic components (e.g., epoxy resin constituting a base compound) of an underfill, and thus tends to exhibit poor filler dispersibility in an underfill. These silanol groups also act as Lewis acids and have activity. Since a finer filler leads to the increase in its surface area in an exponential function manner, a silica filler having a particle size of the order of nm has a far larger surface area than that of a silica filler having an average particle size of 5 to 40 µm. In this case, when a conventional silane coupling agent having high activity as described in Patent Literature 2 is used in surface treatment of the silica filler, silanol groups present at the surface of the silica filler and the silane coupling agent excessively react with each other, which leads to poor dispersibility of the filler in an underfill, hence the increase in viscosity of the underfill, and consequently poor injection properties thereof in injection into gaps between a semiconductor device and a substrate.

The present invention has been made based on the above findings and provides

A liquid sealing material comprising: a liquid epoxy resin as an ingredient (A); a curing agent as an ingredient (B); a silica filler (1) having an average particle size of 7 to 50 nm and surface-treated with 2-(3,4-epoxycyclohexyl)ethyltrimethoxysilane as an ingredient (C); and a silica filler (2) having an average particle size of 0.2 to 5 µm as an ingredient (D), wherein a total content of the silica filler (1) as the ingredient (C) and the silica filler (2) as the ingredient (D) is 45 to 77 parts by weight with respect to 100 parts by weight in total of all ingredients of the liquid sealing material, and wherein a compounding ratio (weight ratio) between the silica filler (1) as the ingredient (C) and the silica filler (2) as the ingredient (D) is 1:10.2 to 1:559.

In the liquid sealing material according to present invention, it is preferred that the liquid epoxy resin as the ingredient (A) and the silica filler (1) as the ingredient (C) are mixed in advance.

In the liquid sealing material according to present invention, it is preferred that the curing agent as the ingredient (B) is an amine curing agent.

In the liquid sealing material according to present invention, it is preferred that the silica filler (2) as the ingredient (D) is surface-treated with a silane coupling agent.

In the liquid sealing material according to present invention, it is preferred that the liquid sealing material further comprises a Lewis base or its salt as an ingredient (E).

It is preferred that the ingredient (E) is triphenylphosphine.

The present invention further provides a semiconductor apparatus comprising a flip-chip semiconductor device sealed with the liquid sealing material according to present invention.

Advantageous Effects of Invention

The liquid sealing material of the invention has excellent injection properties in injection into gaps between a semiconductor device and a substrate.

In addition, the liquid sealing material of the invention is configured to have low thermal expansion and therefore can prevent a low-K layer from being broken or cracks from occurring in solder bumps due to thermal stress in a semiconductor apparatus sealed with the liquid sealing material of the invention.

DESCRIPTION OF EMBODIMENTS

Next, the liquid sealing material of the invention is described in detail.

A resin composition of the invention contains ingredients (A) to (D) described below as essential ingredients.
(A) Liquid Epoxy Resin A liquid epoxy resin as the ingredient (A) is an ingredient constituting a base compound of the liquid sealing material of the invention.

In the present invention, the liquid epoxy resin refers to an epoxy resin which is liquid at ordinary temperature.

Illustrative examples of the liquid epoxy resin in the invention include bisphenol A epoxy resins having an average molecular weight of about 400 or less; branched polyfunctional bisphenol A epoxy resins such as p-glycidyloxyphenyldimethyl trisbisphenol A diglycidyl ether; bisphenol F epoxy resins; phenol novolac epoxy resins having an average molecular weight of about 570 or less; alicyclic epoxy resins such as vinyl(3,4-cyclohexene)dioxide, (3,4-epoxycyclohexyl)methyl 3,4-epoxycyclohexylcarboxylate, bis(3,4-epoxy-6-methylcyclohexylmethyl)adipate, and 2-(3,4-epoxycyclohexyl)5,1-spiro(3,4-epoxycyclohexyl)-m-dioxane; biphenyl epoxy resins such as 3,3',5,5'-tetramethyl-4,4'-diglycidyloxybiphenyl; glycidyl ester epoxy resins such as diglycidyl hexahydrophthalate, diglycidyl 3-methylhexahydrophthalate, and diglycidyl hexahydroterephthalate; glycidyl amine epoxy resins such as diglycidylaniline, diglycidyltoluidine, triglycidyl-p-aminophenol, tetraglycidyl-m-xylylenediamine, and tetraglycidyl bis(aminomethyl) cyclohexane; as well as hydantoin epoxy resins such as 1,3-diglycidyl-5-methyl-5-ethylhydantoin; and naphthalene ring-containing epoxy resins. Silicone skeleton-containing epoxy resins such as 1,3-bis(3-glycidoxypropyl)-1,1,3,3-tetramethyldisiloxane may also be used. Other illustrative examples include diepoxide compounds such as (poly)ethylene glycol diglycidyl ether, (poly)propylene glycol diglycidyl ether, butanediol diglycidyl ether, neopentyl glycol diglycidyl ether, and cyclohexane dimethanol diglycidyl ether; and triepoxide compounds such as trimethylol propane triglycidyl ether, and glycerol triglycidyl ether.

Of these, liquid bisphenol epoxy resins, liquid aminophenol epoxy resins, silicone modified epoxy resins and naphthalene epoxy resins are preferable. Liquid bisphenol A epoxy resins, liquid bisphenol F epoxy resins, p-aminophenol liquid epoxy resins, and 1,3-bis(3-glycidoxypropyl) tetramethyldisiloxane are more preferable.

The liquid epoxy resins for the ingredient (A) may be used alone or in combination of two or more thereof.

An epoxy resin which is solid at ordinary temperature can also be used by combination use with a liquid epoxy resin if it exhibits a liquid state in the form of a mixture.
(B) Curing Agent The curing agent as the ingredient (B) is not particularly limited as long as it is an epoxy resin curing agent. Known curing agents can be used, and any of an acid anhydride curing agent, an amine curing agent and a phenolic curing agent may be used.

Specific examples of acid anhydride curing agents include alkylated tetrahydrophthalic anhydrides such as methyltetrahydrophthalic anhydride, methylhexahydrophthalic anhydride, and methyltetrahydrophthalic anhydride; hexahydrophthalic anhydride; methyl himic anhydride; succinic anhydride substituted with an alkenyl group; methyl nadic anhydride; and glutaric anhydride.

Specific examples of amine curing agents include aliphatic polyamines such as triethylenetetramine, tetraethylenepentamine, m-xylenediamine, trimethylhexamethylenediamine, and 2-methylpentamethylenediamine; alicyclic polyamines such as isophorone diamine, 1,3-bisaminomethylcyclohexane, bis(4-aminocyclohexyl)methane, norbornene diamine, and 1,2-diaminocyclohexane; piperazine polyamines such as N-aminoethyl piperazine and 1,4-bis(2-amino-2-methylpropyl)piperazine; and aromatic polyamines such as diethyltoluenediamine, dimethylthiotoluenediamine, 4,4'-diamino-3,3'-diethyldiphenylmethane, bis(methylthio) toluenediamine, diaminodiphenylmethane, m-phenylenediamine, diaminodiphenylsulfone, diethyltoluenediamine, trimethylene bis(4-aminobenzoate), and polytetramethylene oxide-di-p-aminobenzoate. Exemplary commercial products include T-12 (trade name; manufactured by Sanyo Chemical Industries, Ltd.) (amine equivalent: 116).

Specific examples of phenolic curing agents include all kinds of phenolic hydroxyl group-containing monomers, oligomers and polymers, such as phenol novolac resins and their alkylated or allylated products, cresol novolac resins, phenol aralkyl (phenylene or biphenylene skeleton-containing) resins, naphthol aralkyl resins, triphenolmethane resins and dicyclopentadiene phenol resins.

Of these, amine curing agents are preferable because of their excellent moisture resistance and thermal cycle resistance. In particular, diethyltoluenediamine, dimethylthiotoluenediamine, and 4,4'-diamino-3,3'-diethyldiphenylmethane are preferable because of their excellent heat resistance, mechanical properties, adhesion, electric properties, and moisture resistance. They also exhibit a liquid state at ordinary temperature and thus preferable as the curing agent of the liquid sealing material.

The curing agents for the ingredient (B) may be used alone or in combination of two or more thereof.

In the liquid sealing material according to the invention, the amount of the curing agent as the ingredient (B) to be incorporated is not particularly limited and is preferably in a range of 0.5 to 1.6 equivalents and more preferably 0.6 to 1.3 equivalents per equivalent of epoxy groups in the liquid epoxy resin as the ingredient (A).

(C) Silica Filler (1)
(D) Silica Filler (2)

The silica filler (1) as the ingredient (C) and the silica filler (2) as the ingredient (D) are added to the liquid sealing material in order to improve the moisture resistance and the thermal cycle resistance, in particular the thermal cycle resistance of a sealed portion. The thermal cycle resistance is improved by adding the silica fillers because expansion and contraction of the cured liquid sealing material due to thermal cycling can be suppressed by reducing the coefficient of linear expansion.

The liquid sealing material of the invention uses two types of silica fillers having different average particle sizes from each other, that is, the silica filler (1) having an average particle size of 7 to 50 nm as the ingredient (C) and the silica filler (2) having an average particle size of 0.2 to 5 μm as the ingredient (D) in combination. The reason why two types of silica fillers having different average particle sizes from each other are used in combination is as follows:

Focusing solely on a silica filler, when how to bring a silica filler into the closest packed state is considered, compared to the use of only a silica filler having an average particle size in a single range, i.e., a single particle size, it is more preferable to use in combination two types of silica fillers having different average particle sizes from each other, that is, silica fillers having multicomponent particle sizes. The reason is that silica filler particles having a smaller particle size enter between silica filler particles having a larger particle size, and this allows silica fillers, as a whole, to be more closely packed. When silica fillers are getting close to the closest packed state as a single substance, this brings about the improvement in dispersibility because, in a liquid sealing material having the silica fillers as its ingredients, the distance between silica filler particles increases. This occurs because the amount of resin ingredient contributing to fluidity of the liquid sealing material increases. As a result, the viscosity of the liquid sealing material lowers, which improves injection properties in injection into gaps between a semiconductor device and a substrate. For the foregoing reason, it is preferable for the silica filler (1) as the ingredient (C) and the silica filler (2) as the ingredient (D) to have a large difference in average particle size.

The silica filler (1) as the ingredient (C) has an average particle size of 7 to 50 nm, and in order to improve dispersibility thereof in the liquid sealing material, needs to be surface-treated with a silane coupling agent in advance. As described above, however, such a silica filler having a particle size of the order of nm has a far larger surface area than that of a silica filler having an average particle size of 5 to 40 μm described in Patent Literature 2. Therefore, when a conventional silane coupling agent having high activity as described in Patent Literature 2 is used, silanol groups present at the surface of the silica filler and the silane coupling agent excessively react with each other, which leads to poor dispersibility of the silica filler in a liquid sealing material, hence the increase in viscosity of the liquid sealing material, and consequently poor injection properties thereof in injection into gaps between a semiconductor device and a substrate.

To cope with it, the liquid sealing material of the invention uses the silica filler (1) as the ingredient (C) which has been surface-treated with 2-(3,4-epoxycyclohexyl) ethyltrimethoxysilane in advance.

2-(3,4-Epoxycyclohexyl)ethyltrimethoxysilane has the structure shown below and has a cyclic ring at its end.

[Chemical Formula 1]

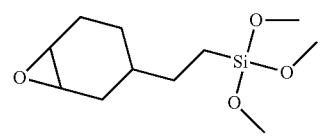

The steric hindrance due to this cyclic ring works to restrict the activity compared to a glycidyl group of a glycidyl ether type silane coupling agent that is conventionally used as in Patent Literature 2. Accordingly, silanol groups present at the surface of the silica filler moderately reacts with 2-(3,4-epoxycyclohexyl)ethyltrimethoxysilane used as the silane coupling agent, thus leading to excellent dispersibility in the liquid sealing material. As a consequence, the viscosity of the liquid sealing material is prevented from increasing, and therefore, injection properties are excellent in injection into gaps between a semiconductor device and a substrate.

The method of surface treatment of a silica filler using 2-(3,4-epoxycyclohexyl)ethyltrimethoxysilane as the silane coupling agent is not particularly limited and can be performed by, for example, a stirring process, a wet process or a dry process.

The stirring process is a process in which a silane coupling agent and a silica filler are previously charged into a stirring device and stirred under suitable conditions. A mixer capable of stirring and mixing at a high revolution speed, as exemplified by Henschel mixer can be used as the stirring device but the stirring device used is not limited thereto.

In the wet process, a silane coupling agent in a sufficient amount for the surface area of a silica filler to be surface-treated is dissolved in water or an organic solvent to hydrolyze a compound constituting the silane coupling agent, i.e., 2-(3,4-epoxycyclohexyl) ethyltrimethoxysilane, thereby obtaining a surface treating solution. The silica filler is added to the resultant surface treating solution and the mixture is stirred to be turned into a slurry. After the silane coupling agent and the silica filler are sufficiently reacted by stirring, the silica filler is separated from the surface treating solution by a method such as filtration or centrifugation and dried under heating.

The dry process is a process which performs treatment by uniformly dispersing a silane coupling agent in the form of a stock solution or a solution in a silica filler which is being stirred at a high speed by a stirring device. A mixer capable of stirring and mixing at a high revolution speed, as exemplified by Henschel mixer can be used as the stirring device but the stirring device used is not limited thereto.

In addition to the above-described stirring, wet and dry processes, for example, an integral blend process in which a silane coupling agent is directly added to a silica filler dispersion obtained by dispersing a silica filler in a solvent, thereby modifying the surface of the silica filler can also be suitably used.

When the silica filler (1) as the ingredient (C) has an average particle size of less than 7 nm, the specific surface area of the silica filler increases in an exponential function manner, which leads to poor dispersibility of the silica filler (1) as the ingredient (C) in the liquid sealing material, resulting in poor injection properties of the liquid sealing material in injection into gaps between a semiconductor device and a substrate.

When the silica filler (1) as the ingredient (C) has an average particle size of more than 50 nm, the difference in average particle size between this silica filler and the silica filler (2) as the ingredient (D) is to be smaller, which leads to poor dispersibility of both the silica filler (1) as the ingredient (C) and the silica filler (2) as the ingredient (D) in the liquid sealing material, resulting in poor injection properties of the liquid sealing material in injection into gaps between a semiconductor device and a substrate.

The silica filler (1) as the ingredient (C) preferably has an average particle size of 7 to 15 nm.

The silica filler (1) as the ingredient (C) is not particularly limited in shape and may be in any of a particle shape, a powder shape and a scale-like shape. In the case where the silica filler has a shape other than a particle shape, the average particle size of the silica filler refers to the average maximum diameter of the silica filler.

It is preferable for the silica filler to have a substantially spherical shape with a sphericity of 0.8 or more because the dispersibility of the silica filler in the liquid sealing material and the injection properties of the liquid sealing material can be improved while the silica filler can be brought much closer to the closest packed state. The term "sphericity" as used in the description is defined as the ratio of the minimum diameter to the maximum diameter in a particle. For example, the ratio of the minimum diameter to the maximum diameter observed with a scanning electron microscope (SEM) should be 0.8 or more. The silica filler as the ingredient (C) preferably has a sphericity of 0.9 or more.

The silica filler (2) as the ingredient (D) has an average particle size of 0.2 to 5 μm and therefore has no problem in dispersibility in the liquid sealing material even without surface treatment. However, the use of the silica filler (2), as the ingredient (D), having been previously surface-treated with a silane coupling agent improves its dispersibility in the liquid sealing material, and therefore the thus surface-treated silica filler (2) as the ingredient (D) is favorable for increasing the content thereof.

A variety of silane coupling agents such as vinyl-based, glycidoxy-based, methacryl-based, amino-based and mercapto-based silane coupling agents can be used for surface treatment of the silica filler (2) as the ingredient (D).

The method of surface treatment of the silica filler using a silane coupling agent is the same as that described for the silica filler (1) as the ingredient (C).

When the silica filler (2) as the ingredient (D) has an average particle size of less than 0.2 μm, the specific surface area of the silica filler increases in an exponential function manner as described above, and accordingly, the viscosity of the liquid sealing material increases, resulting in poor injection properties thereof in injection into gaps between a semiconductor device and a substrate.

When the silica filler (2) as the ingredient (D) has an average particle size of more than 5 μm, the size of the silica filler is too large for gaps between a semiconductor device and a substrate, and inclusion of air causes voids during injection, disadvantageously.

The silica filler (2) as the ingredient (D) preferably has an average particle size of 0.25 to 0.6 μm.

For the shape of the silica filler (2) as the ingredient (D), the same applies as described for the silica filler (1) as the ingredient (C).

In the liquid sealing material of the invention, the total content of the silica filler (1) as the ingredient (C) and the silica filler (2) as the ingredient (D) is 45 to 77 parts by weight with respect to 100 parts by weight in total of all ingredients of the liquid sealing material.

When the total content of the silica fillers (1) and (2) is less than 45 parts by weight, the coefficient of linear expansion of the liquid sealing material increases, thus leading to poor thermal cycle resistance of a portion sealed with the liquid sealing material.

When the total content of the silica fillers (1) and (2) is more than 77 parts by weight, the viscosity of the liquid sealing material increases, resulting in poor injection properties thereof in injection into gaps between a semiconductor device and a substrate.

The total content of the silica fillers (1) and (2) more preferably ranges from 50 to 70 parts by weight.

In the liquid sealing material of the invention, the compounding ratio (weight ratio) of the silica filler (1) as the ingredient (C) to the silica filler (2) as the ingredient (D) is 1:10.2 to 1:559.

When the compounding ratio of the silica filler (1) is higher than 1:10.2, this leads to poor dispersibility of the silica filler (1) in the liquid sealing material, hence the increase in viscosity of the liquid sealing material, and consequently poor injection properties thereof in injection into gaps between a semiconductor device and a substrate.

When the compounding ratio of the silica filler (1) is lower than 1:559, this leads to poor dispersibility of the silica fillers (1) and (2) or the silica filler (2) in the liquid sealing material, resulting in poor injection properties of the liquid sealing material in injection into gaps between a semiconductor device and a substrate.

The compounding ratio between the silica fillers (1) and (2) more preferably ranges from 1:17.7 to 1:111, and more preferably from 1:17.7 to 1:76.

The liquid sealing material of the invention may optionally contain ingredients to be mentioned below in addition to the foregoing ingredients (A) to (D).

(E) Lewis Base or its Salt

The liquid sealing material of the invention may contain a Lewis base or its salt as an ingredient (E).

As described above, the silica filler (1) as the ingredient (C) and the silica filler (2) as the ingredient (D) have a number of silanol groups, which are hydrophilic groups, on their surfaces. These silanol groups also act as Lewis acids and have activity.

The presence of the Lewis base or its salt as the ingredient (E) makes it possible to minimize Lewis acid activity of silanol groups present at the surfaces of the silica fillers (1) and (2). This further improves dispersibility of the silica fillers (1) and (2) in the liquid sealing material, and accordingly, further improves injection properties of the liquid sealing material in injection into gaps between a semiconductor device and a substrate.

Examples of the Lewis base or its salt as the ingredient (E) that may be used include imidazoles, amine compounds such as 1,5-diazabicyclo[4.3.0]non-5-ene and 1,8-diazabicyclo[5.4.0]undec-7-ene or their salts, phosphine compounds such as triphenylphosphine, diphenylphosphine and phenylphosphine or their salts.

Of these, triphenylphosphine is preferred because it effectively acts on silanol groups present at the silica filler surfaces, leading to improved storage stability of the liquid sealing material.

When the Lewis base as the ingredient (E) is contained, the Lewis base content in the liquid sealing material of the invention is preferably 0.1 to 0.8 parts by weight and more preferably 0.2 to 0.5 parts by weight with respect to 100 parts by weight in total of the silica filler (1) as the ingredient (C) and the silica filler (2) as the ingredient (D).

(Other Compounding Agents)

The liquid sealing material of the invention may further optionally contain other ingredients than the foregoing ingredients (A) to (E). Specific examples of such ingredients that may be incorporated include elastomers, a curing accelerator, a metal complex, a leveling agent, a colorant, an ion trapping agent, an antifoaming agent, and a flame retardant. The type and the amount of each compounding agent to be incorporated are determined according to a conventional method.

(Preparation of Liquid Sealing Material)

The liquid sealing material of the invention is prepared by mixing with stirring the above-described ingredients (A) to (D), and the ingredient (E) if it is to be incorporated, and further optionally other compounding agents to be incorporated.

Mixing with stirring can be performed using a roll mill but is of course not limited to this. In the case where the epoxy resin as the ingredient (A) is solid, it is preferably liquefied or fluidized by heating or other process and mixed.

The mixing method may be appropriately changed. For example, the respective ingredients may be mixed together at a time. Alternatively, part of the ingredients may be first mixed before mixing the rest of the ingredients. When it is hard for the silica filler (1) as the ingredient (C) to be uniformly dispersed in the liquid epoxy resin as the ingredient (A), the liquid epoxy resin as the ingredient (A) and the silica filler (1) as the ingredient (C) may be first mixed before mixing the rest of the ingredients.

Next, the characteristics of the liquid sealing material of the invention are described.

The liquid sealing material of the invention preferably has a viscosity of up to 200 Pa·s at ordinary temperature (25° C.) and has good injection properties when used as underfill.

The liquid sealing material of the invention have a viscosity of more preferably up to 100 Pa·s at ordinary temperature (25° C.)

When used as underfill, the liquid sealing material of the invention exhibits excellent injection properties through capillary flow. Specifically, when injection into gaps is evaluated by a procedure described below in Examples, injecting time is preferably 1200 seconds or longer.

Next, a method of using the liquid sealing material according to the invention is described in connection with its use as underfill.

When the liquid sealing material of the invention is used as underfill, the liquid sealing material of the invention is filled into gaps between a substrate and a semiconductor device according to the following procedure.

When the liquid sealing material of the invention is applied to one end of the semiconductor device while heating the substrate to 70 to 130° C., for example, the liquid sealing material of the invention is filled into the gaps between the substrate and the semiconductor device by capillary action. In this process, the substrate may be inclined or a pressure difference may be caused between inside and outside the gaps in order to shorten the time required to fill the liquid sealing material of the invention.

After the gaps are filled with the liquid sealing material of the invention, the substrate is heated at a predetermined temperature for a predetermined period of time, to be more specific, at 80 to 200° C. for 0.2 to 6 hours to cure the liquid sealing material under heating, thereby sealing the gaps.

The semiconductor apparatus of the invention uses the liquid sealing material of the invention as underfill to seal portions to be sealed, in other words, gaps between a substrate and a semiconductor device according to the above-described procedure. Exemplary semiconductor devices where sealing is to be performed include, but are not particularly limited to, an integrated circuit, a large-scale integrated circuit, a transistor, a thyristor and a diode and a capacitor.

EXAMPLES

The invention is described below in further detail by way of examples. However, the invention should not be construed as being limited thereto.

Examples 1 to 15 and Comparative Examples 1 to 6

A roll mill was used to knead ingredients at compounding ratios shown in Tables below to prepare liquid sealing materials in Examples 1 to 15 and Comparative Examples 1 to 6. Note that the liquid epoxy resin as the ingredient (A) and the silica filler (1) as the ingredient (C) were first mixed and then the rest of ingredients were mixed. Numerical values on the respective compositions in Tables are expressed by parts by weight.

(A) Epoxy Resin

Epoxy resin A-1: Bisphenol F epoxy resin; product name: YDF8170; New Nippon Steel Chemical Co., Ltd.; epoxy equivalent: 158

Epoxy resin A-2: Aminophenol epoxy resin; product name: jER630; Mitsubishi Chemical Corporation; epoxy equivalent: 94 g/eq Epoxy resin A-3: 1,4-Hexanedimethanoldiglycidyl ether; product name: EP-40855; ADEKA Corporation; epoxy equivalent: 135 g/eq (B) Curing Agent Curing agent B-1: 4,4'-Diamino-3,3'-diethyldiphenylmethane; product name: KAYAHARD A-A; Nippon Kayaku Co., Ltd.

Curing agent B-2: Diethyltrienediamine; product name: ETHACURE 100; Albemarle Japan Corporation Curing agent B-3: Dimethylthiotoluenediamine; product name: HARTCURE 30; Johnson Fine Chemical (C) Silica Filler (1)

Silica filler C-1: 2-(3,4-Epoxycyclohexyl) ethyltrimethoxysilane surface-treated silica filler (average particle size: 7 nm); product name: YN010A-JGP; Admatechs Company Limited Silica filler C-2: 2-(3,4-Epoxycyclohexyl) ethyltrimethoxysilane surface-treated silica filler (average particle size: 10 nm); product name: YA010A-JGP; Admatechs Company Limited Silica filler C-3: 2-(3,4-Epoxycyclohexyl)ethyltrimethoxysilane surface-treated silica filler (average particle size: 50 nm); product name: YA050A-JGP; Admatechs Company Limited Silica filler C-4: 2-(3,4-Epoxycyclohexyl)ethyltrimethoxysilane surface-treated silica filler (average particle size: 100 nm); product name: YC100A-JGP; Admatechs Company Limited Silica filler C-5: Surface-untreated silica filler (average particle size: 12 nm); product name: R200; Evonik Industries AG Silica filler C-6: Trimethylsilyl surface-treated silica filler (average particle size: 12 nm); product name: RX200; Evonik Industries AG Silica filler C-7: Octylsilyl surface-treated silica filler (average particle size: 12 nm); product name: R805; Evonik Industries AG (D) Silica Filler (2)

Silica filler D-1: Surface-untreated silica filler (average particle size: 0.3 μm); product name: SP-03B; Fuso Chemical Co., Ltd.

Silica filler D-2: Silane coupling agent (3-glycidoxypropyltrimethoxysilane) surface-treated silica filler (average particle size: 0.25 μm); product name: SE1053-SEO; Admatechs Company Limited Silica filler D-3: Silane coupling agent (3-glycidoxypropyltrimethoxysilane) surface-treated silica filler (average particle size: 0.5 μm); product name: SE2200-SEE; Admatechs Company Limited Silica filler D-4: Silane coupling agent (3-glycidoxypropyltrimethoxysilane) surface-treated silica filler (average particle size: 1.5 μm); product name: SE5050-SEJ; Admatechs Company Limited (E) Lewis Base Lewis base E-1: Triphenylphosphine; product name: TPP; Hokko Chemical Industry Co., Ltd.

The prepared liquid sealing materials were used as evaluation samples to perform the following evaluations.

(Viscosity)

A Brookfield viscometer was used to measure the viscosity of the evaluation samples just after being prepared at a solution temperature of 25° C. and 50 rpm.

(Thixotropy Index (T.I.))

A rotational viscometer HBDV-1 (with a spindle SC4-14) available from Brookfield was used to measure the viscosity (Pa·s) at 5 rpm and 25° C. and the viscosity (Pa·s) at 50 rpm and 25° C. Each value obtained by dividing a viscosity measurement at 5 rpm by a viscosity measurement at 50 rpm (the ratio of the viscosity at 5 rpm to the viscosity at 50 rpm) is shown as a thixotropy index.

(Injection Properties)

Specimens were each prepared by fixing, instead of a semiconductor device, a glass plate on an organic substrate (FR-4 substrate) with a 20 or 50 μm gap therebetween. The thus prepared specimen was placed on a hot plate set at 110° C., and a liquid sealing material was applied from one end side of the glass plate. The time taken for an injection distance to reach 20 mm was measured. This procedure was repeated twice, and the average of measurements was taken as the measurement of injection time.

TABLE 1

|  | Example 1 | Example 2 | Example 3 | Example 4 | Example 5 | Example 6 | Example 7 |
|---|---|---|---|---|---|---|---|
| Epoxy resin A-1 | 32.3 | 32.3 | 32.3 | 3 | 3 | 32.5 | 32.08 |
| Epoxy resin A-2 |  |  |  | 24.8 |  |  |  |
| Epoxy resin A-3 |  |  |  |  | 28 |  |  |
| Curing agent B-1 | 11.7 | 11.7 | 11.7 | 16.2 | 13 | 5.75 | 11.7 |
| Curing agent B-2 |  |  |  |  |  |  |  |
| Curing agent B-3 |  |  |  |  |  | 5.75 |  |
| Silica filler C-1 | 1 |  |  |  |  |  |  |
| Silica filler C-2 |  | 1 |  | 1 | 1 | 1 | 1 |
| Silica filler C-3 |  |  | 1 |  |  |  |  |
| Silica filler C-4 |  |  |  |  |  |  |  |
| Silica filler C-5 |  |  |  |  |  |  |  |
| Silica filler C-6 |  |  |  |  |  |  |  |
| Silica filler C-7 |  |  |  |  |  |  |  |
| Silica filler D-1 | 55 | 55 | 55 | 55 | 55 | 55 | 55 |
| Silica filler D-2 |  |  |  |  |  |  |  |
| Silica filler D-3 |  |  |  |  |  |  |  |
| Silica filler D-4 |  |  |  |  |  |  |  |
| Lewis base E-1 |  |  |  |  |  |  | 0.22 |
| Total | 100 | 100 | 100 | 100 | 100 | 100 | 100 |
| Silica filler content | 56 | 56 | 56 | 56 | 56 | 56 | 56 |

TABLE 1-continued

|  | Example 1 | Example 2 | Example 3 | Example 4 | Example 5 | Example 6 | Example 7 |
|---|---|---|---|---|---|---|---|
| Curing agent equivalent/ Epoxy equivalent | 0.9 | 0.9 | 0.9 | 0.9 | 0.9 | 0.9 | 0.9 |
| Viscosity (50 rpm) [Pa · s] | 70.0 | 73.0 | 65.0 | 26.4 | 1.9 | 22.2 | 33.4 |
| T.I. | 0.4 | 0.41 | 0.43 | 0.53 | 1.32 | 0.54 | 0.48 |
| 20 mm Injection properties (110° C.) |  |  |  |  |  |  |  |
| 50 μm | 350 | 357 | 400 | 188 | 121 | 195 | 243 |
| 20 μm | 669 | 673 | 802 | 328 | 220 | 327 | 382 |

TABLE 2

|  | Example 8 | Example 9 | Example 10 | Example 11 | Example 12 | Example 13 | Example 14 | Example 15 |
|---|---|---|---|---|---|---|---|---|
| Epoxy resin A-1 | 32.23 | 32.23 | 32.23 | 32.23 | 25.7 | 20.8 | 4.85 | 40.33 |
| Epoxy resin A-2 |  |  |  |  |  |  | 7.1 |  |
| Epoxy resin A-3 |  |  |  |  |  |  | 4 |  |
| Curing agent B-1 | 11.8 | 11.8 | 11.8 | 11.8 | 9 | 9.20 | 4.7 | 14.67 |
| Curing agent B-2 |  |  |  |  |  |  | 2.35 |  |
| Curing agent B-3 |  |  |  |  |  |  |  |  |
| Silica filler C-1 |  |  |  |  |  |  |  |  |
| Silica filler C-2 | 0.1 | 0.5 | 3 | 5 | 1 | 1 | 1 | 1 |
| Silica filler C-3 |  |  |  |  |  |  |  |  |
| Silica filler C-4 |  |  |  |  |  |  |  |  |
| Silica filler C-5 |  |  |  |  |  |  |  |  |
| Silica filler C-6 |  |  |  |  |  |  |  |  |
| Silica filler C-7 |  |  |  |  |  |  |  |  |
| Silica filler D-1 | 55.9 | 55.5 | 53 | 51 |  |  |  | 44 |
| Silica filler D-2 |  |  |  |  |  |  | 15.2 |  |
| Silica filler D-3 |  |  |  |  | 64 |  |  |  |
| Silica filler D-4 |  |  |  |  |  | 69 | 60.8 |  |
| Lewis base E-1 |  |  |  |  |  |  |  |  |
| Total | 100 | 100 | 100 | 100 | 100 | 100 | 100 | 100 |
| Silica filler content | 56 | 56 | 56 | 56 | 65 | 70 | 77 | 45 |
| Curing agent equivalent/ Epoxy equivalent | 0.9 | 0.9 | 0.9 | 0.9 | 0.9 | 1.1 | 0.9 | 0.9 |
| Viscosity (50 rpm) [Pa · s] | 38.6 | 45.4 | 68.4 | 73.2 | 48.6 | 92.4 | 71.8 | 5.0 |
| T.I. | 0.52 | 0.44 | 0.61 | 0.82 | 0.45 | 0.48 | 0.47 | 0.4 |
| 20 mm Injection properties (110° C.) |  |  |  |  |  |  |  |  |
| 50 μm | 437 | 387 | 330 | 319 | 206 | 192 | 750 | 46 |
| 20 μm | 709 | 668 | 649 | 657 | 403 | 367 | 1198 | 101 |

TABLE 3

|  | Comparative example 1 | Comparative example 2 | Comparative example 3 | Comparative example 4 | Comparative example 5 | Comparative example 6 |
|---|---|---|---|---|---|---|
| Epoxy resin A-1 | 32.3 | 32.3 | 32.3 | 32 | 32 | 32.2 |
| Epoxy resin A-2 |  |  |  |  |  |  |
| Epoxy resin A-3 |  |  |  |  |  |  |
| Curing agent B-1 | 11.7 | 11.7 | 11.7 | 11.7 | 12 | 11.77 |
| Curing agent B-2 |  |  |  |  |  |  |
| Curing agent B-3 |  |  |  |  |  |  |
| Silica filler C-1 |  |  |  |  |  |  |
| Silica filler C-2 |  |  |  |  | 0 | 10 |
| Silica filler C-3 |  |  |  |  |  |  |
| Silica filler C-4 | 1 |  |  |  |  |  |
| Silica filler C-5 |  | 1 |  |  |  |  |
| Silica filler C-6 |  |  | 1 |  |  |  |
| Silica filler C-7 |  |  |  | 1 |  |  |

TABLE 3-continued

| | Comparative example 1 | Comparative example 2 | Comparative example 3 | Comparative example 4 | Comparative example 5 | Comparative example 6 |
|---|---|---|---|---|---|---|
| Silica filler D-1 | 55 | 55 | 55 | 55 | 56 | 46 |
| Silica filler D-2 | | | | | | |
| Silica filler D-3 | | | | | | |
| Silica filler D-4 | | | | | | |
| Lewis base E-1 | | | | | | |
| Total | 100 | 100 | 100 | 100 | 100 | 100 |
| Silica filler | 56 | 56 | 56 | 56 | 56 | 56 |
| Curing agent equivalent/ Epoxy equivalent | 0.9 | 0.9 | 0.9 | 0.9 | 0.9 | 0.9 |
| Viscosity (50 rpm) [Pa · s] | 61.8 | >200 | 189.2 | >200 | 85.4 | >200 |
| T.I. | 0.42 | Error | 0.31 | Error | 0.44 | Error |
| 20 mm Injection properties (110° C.) | | | | | | |
| 50 µm | 9 mm | 8 mm | 6 mm | 5 mm | 9 mm | 17 mm |
| 20 µm | 14 mm | 12.5 mm | 10.5 mm | 11 mm | 15 mm | 13 mm |

For the liquid sealing materials in Examples 1 to 15, all the evaluation results of the viscosity measured at a solution temperature of 25° C. and 50 rpm, the thixotropy index (T.I.) and the 20 mm injection properties were excellent.

In Example 7 in which a Lewis base (triphenylphosphine) was added as the ingredient (E), physical properties of the liquid sealing material (viscosity, T. I. and 20 mm injection properties) were further excellent.

In Examples 13 to 15 in each of which a silica filler surface-treated with a silane coupling agent was used as the silica filler 2 as the ingredient (D), the content of the silica filler 2 can be increased without impairing the physical properties (viscosity, T.I. and 20 mm injection properties) of the liquid sealing material.

In contrast, in Comparative Example 1 in which a silica filler having an average particle size of more than 50 nm (i.e., 100 nm) was used as the silica filler 1 as the ingredient (C), the 20 mm injection properties of the liquid sealing material were poor. In Comparative Example 2 in which a surface-untreated silica filler was used as the silica filler 1 as the ingredient (C), Comparative Examples 3 and 4 in each of which a silica filler had been surface-treated with a coupling agent other than 2-(3,4-epoxycyclohexyl) ethylt-rimethoxysilane, and Comparative Example 5 in which the compounding ratio of the silica filler 1 as the ingredient (C) to the silica filler 2 as the ingredient (D) was higher than 1:10.2, the physical properties (viscosity, T.I. and 20 mm injection properties) of each liquid sealing material were poor.

The invention claimed is:

1. A liquid sealing material comprising: a liquid epoxy resin as an ingredient (A); a curing agent as an ingredient (B); a silica filler having an average particle size of 7 to 50 nm and surface-treated with 2-(3,4-epoxycyclohexyl)ethyl-trimethoxysilane as an ingredient (C); a silica filler having an average particle size of 0.2 to 5 µm as an ingredient (D); and triphenylphosphine as an ingredient (E),
   wherein a total content of the silica filler as the ingredient (C) and the silica filler as the ingredient (D) is 45 to 77 parts by weight with respect to 100 parts by weight in total of all ingredients of the liquid sealing material, and
   wherein a compounding ratio (weight ratio) between the silica filler as the ingredient (C) and the silica filler as the ingredient (D) is 1:17.7 to 1:76.

2. The liquid sealing material according to claim 1, wherein the liquid epoxy resin as the ingredient (A) and the silica filler having an average particle size of 7 to 50 nm and surface-treated with 2-(3,4-epoxycyclohexyl)ethyl-trimethoxysilane as the ingredient (C) are mixed in advance.

3. The liquid sealing material according to claim 1, wherein the curing agent as the ingredient (B) is an amine curing agent.

4. The liquid sealing material according to claim 1, wherein the silica filler as the ingredient (D) is surface-treated with a silane coupling agent.

5. A semiconductor apparatus comprising a flip-chip semiconductor device sealed with the liquid sealing material according to claim 1.

* * * * *